United States Patent [19]

Fischer et al.

[11] Patent Number: 5,481,794
[45] Date of Patent: Jan. 9, 1996

[54] DEVICE FOR HANDLING OBJECTS AND METHOD OF USING SAME

[75] Inventors: Bruno Fischer, Dietikon; Bruno Bachofen, Bonstetten, both of Switzerland

[73] Assignee: Sieba AG, Urdorf, Switzerland

[21] Appl. No.: 634,214

[22] PCT Filed: May 29, 1990

[86] PCT No.: PCT/CH90/00137

§ 371 Date: Feb. 1, 1991

§ 102(e) Date: Feb. 1, 1991

[87] PCT Pub. No.: WO90/15518

PCT Pub. Date: Dec. 13, 1990

[30] Foreign Application Priority Data

Jun. 1, 1989 [CH] Switzerland .............................. 2068/89

[51] Int. Cl.$^6$ ........................... B23P 19/04; B65G 47/32; H01R 43/00; H05K 13/02
[52] U.S. Cl. .................. 29/747; 29/749; 29/757; 29/759; 29/842; 198/468.3; 414/752; 414/753
[58] Field of Search ........................... 29/706, 743, 744, 29/747, 759, 749, 757, 832, 834, 836, 837, 842; 414/750, 751, 752, 753; 198/458, 468.3; 294/104

[56] References Cited

U.S. PATENT DOCUMENTS

| | | | |
|---|---|---|---|
| 3,875,636 | 4/1975 | Schultz, Jr. et al. | 29/747 X |
| 3,987,889 | 10/1976 | Godoy | 198/458 |
| 4,199,050 | 4/1980 | Moller | 198/468.3 |
| 4,316,605 | 2/1982 | Zachry et al. | 29/744 X |
| 4,336,874 | 6/1982 | Kamphues | 198/458 |
| 4,360,100 | 11/1982 | Kamphues | 198/458 |
| 4,372,802 | 2/1983 | Harigane et al. | 29/743 X |
| 4,375,719 | 3/1983 | Kent | 29/759 X |
| 4,559,702 | 12/1985 | Maack et al. | 29/759 |
| 4,588,070 | 5/1986 | Smith | 198/468.3 |
| 4,616,410 | 10/1986 | Stokoe et al. | 29/743 |
| 4,624,050 | 11/1986 | Hawkswell | 414/752 X |
| 4,694,951 | 9/1987 | Gibbemeyer | 198/468.3 |
| 4,832,180 | 5/1989 | Ferrero | 198/468.3 |
| 4,837,926 | 6/1989 | Boutcher, Jr. | 29/747 |
| 4,892,183 | 1/1990 | Fenton | 198/468.3 |
| 4,911,598 | 3/1990 | Savary et al. | 198/468.3 |
| 5,102,287 | 4/1992 | Johnson et al. | 414/753 |

FOREIGN PATENT DOCUMENTS

| | | | |
|---|---|---|---|
| 71303 | 2/1983 | European Pat. Off. | |
| 2950460 | 6/1980 | Germany . | |
| 55-111315 | 8/1980 | Japan | 198/468.3 |
| 59-190110 | 10/1984 | Japan | 198/468.3 |
| 2036611 | 7/1980 | United Kingdom . | |

*Primary Examiner*—Peter Vo
*Attorney, Agent, or Firm*—Sandler, Greenblum & Bernstein

[57] ABSTRACT

A device for simultaneously receiving objects arranged in a first positional arrangement and for simultaneously delivering such objects arranged in a second positional arrangement, and a method of using such device. More particularly, the apparatus includes a plurality of movable object carriers which can slide freely relative to each other on a predetermined path and which can be brought into the position corresponding to the desired distances with a programmable positioning device. In a preferred embodiment, the apparatus can be used in an installation for automatically inserting contact elements in supports for pin and socket connectors and enables the contacts of the pin and socket connectors to be mounted in positions corresponding to a freely chosen pattern.

25 Claims, 9 Drawing Sheets

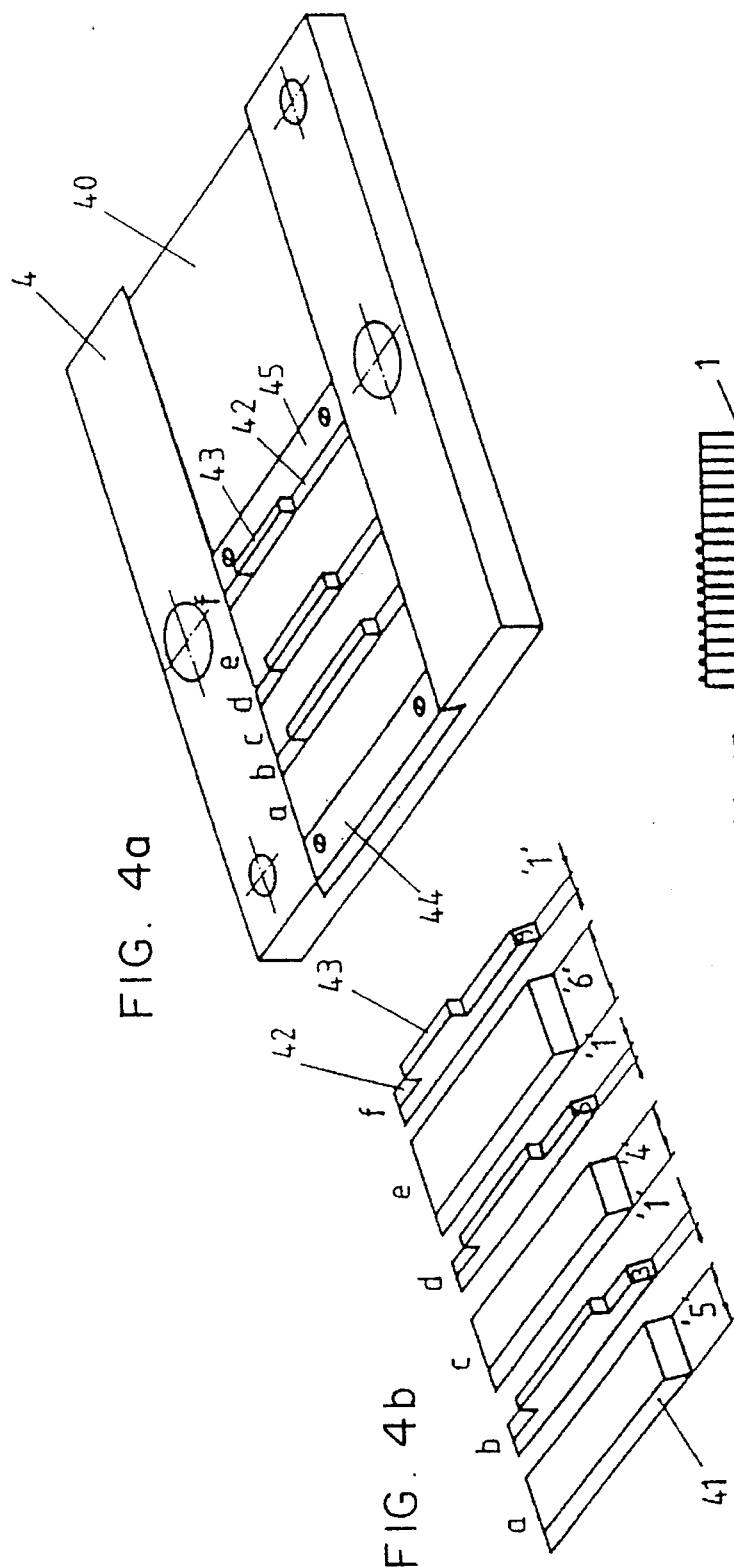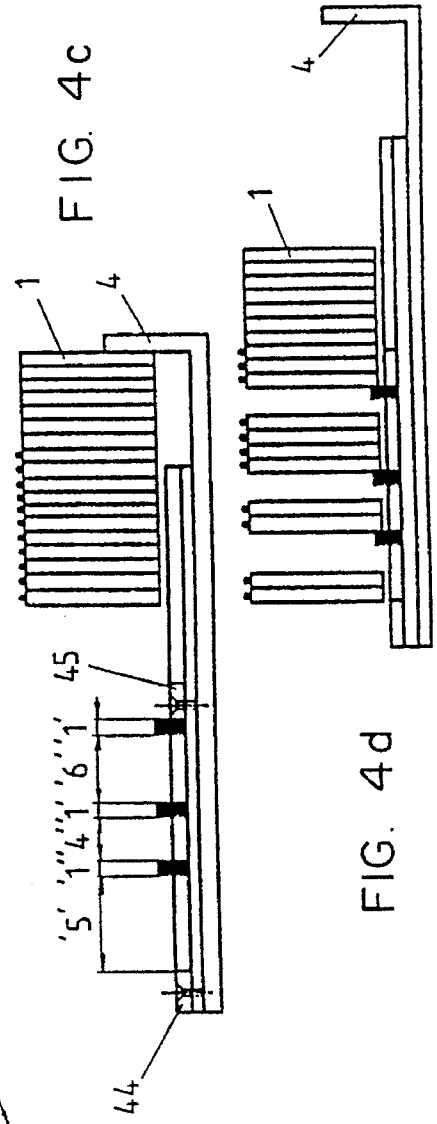

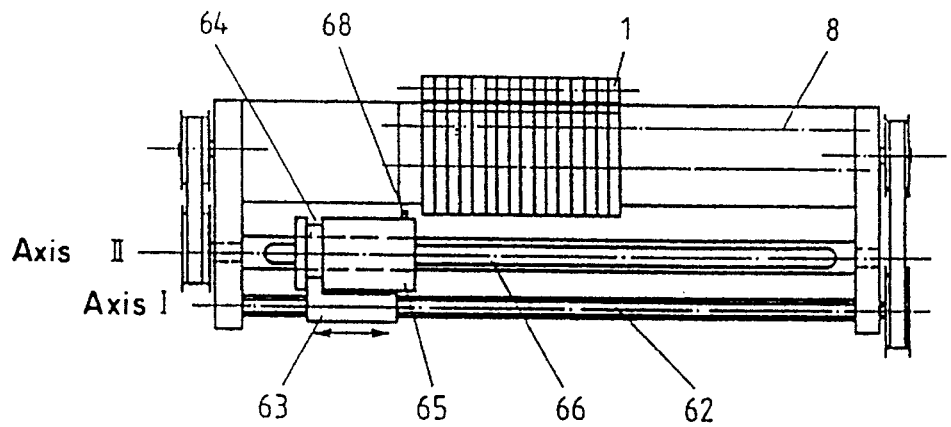
FIG. 6a
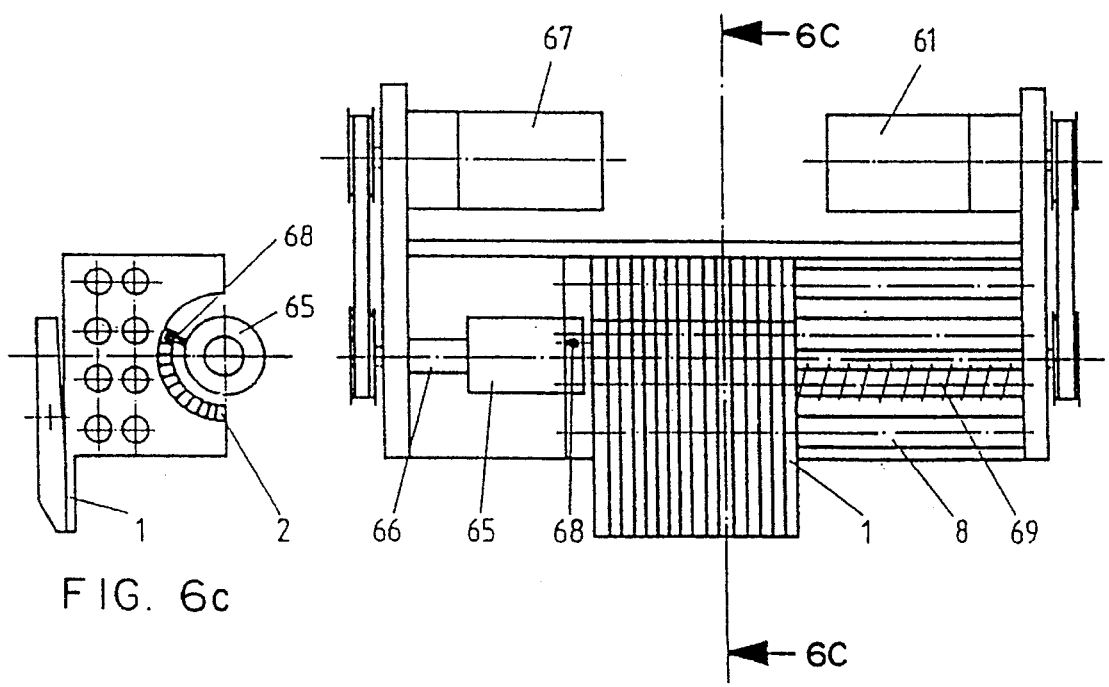
FIG. 6c
FIG. 6b

DEVICE FOR HANDLING OBJECTS AND METHOD OF USING SAME

BACKGROUND OF THE INVENTION

1. Field of the Invention

The present invention is relates to an apparatus for receiving and delivering objects and a method of using such apparatus.

2. Discussion of Background and Relevant Information

In various fields of application in automatic mass production, a problem often arises in connection with removing objects from a delivery device within a processing cycle and forwarding them to a subsequent processing station in a predetermined number. A typical field of application is fitting components of electrical products with connecting elements which are used for making electrical connections with other components. For example, it is necessary to fit printed circuit boards or pin and socket connectors with a plurality of metallic contact elements which are soldered or pressed into openings provided for this purpose. As a rule, the contacts are supplied on bands or conveyors, are removed therefrom and are forwarded for further processing.

A device for inserting connecting pins into a workpiece is known from German Patent Publication No. 2,950,460, in which the connecting pins are removed from a carrier strip by means of a clamping device and are individually supplied to an insertion device. Thus, it is only possible to insert one pin at a time into the workpiece, something which may result in economically unacceptable processing times, particularly in connection with industrial scale production of pin and socket connectors or the like.

It is also known to completely fit individual rows of contacts of pin and socket connectors in one working operation, i.e., to provide all the contact positions of a row simultaneously with contact elements. However, in many applications not all of the contact elements are needed, for which reason there is the need to fit only the actually used positions with a contact element during processing, in which case there can arise various "patterns" for positioning the contacts.

SUMMARY OF THE INVENTION

Therefore, the present invention has as its object to provide a device of the previously mentioned type suitable for various uses, by means of which it is not only possible to simultaneously grasp a plurality of objects, but also to bring them into randomly or selectively chosen distances from each other and to forward them subsequently for further processing. This object is attained in accordance with the invention by means of an apparatus for receiving objects arranged in a first pattern and delivering such objects arranged in a second pattern.

The device allows the simultaneous incorporation of any random or selected number of objects in a processing cycle, wherein the number of objects and their distances from each other within a preset grid pattern can be randomly selected in accordance with the prevailing conditions. In this way it becomes possible in a simple way, for example in the actual field of application mentioned above, to fit the rows of contacts of pin and socket connectors in accordance with a randomly chosen pattern, i.e., to also leave any contact positions selectively free. Using the device in accordance with the invention in connection with an installation for automatically fitting electrical components with contact elements makes it possible, in particular with randomly selected patterns, to simultaneously hold in readiness the packages of contact elements corresponding to the pattern in order to supply them in this manner to the actual mounting station, where they can then be commonly inserted in a single operation into the openings of a carrier provided for them. In comparison with known fitting methods, this permits a considerable shortening of the fitting time.

BRIEF DESCRIPTION OF THE DRAWINGS

Exemplary embodiments and examples of using the device will be described in detail below by means of the drawings, wherein:

FIGS. 4a to 6c illustrate various positioning devices;

DETAILED DESCRIPTION OF THE PREFERRED EMBODIMENTS

Figures 1, 1A:
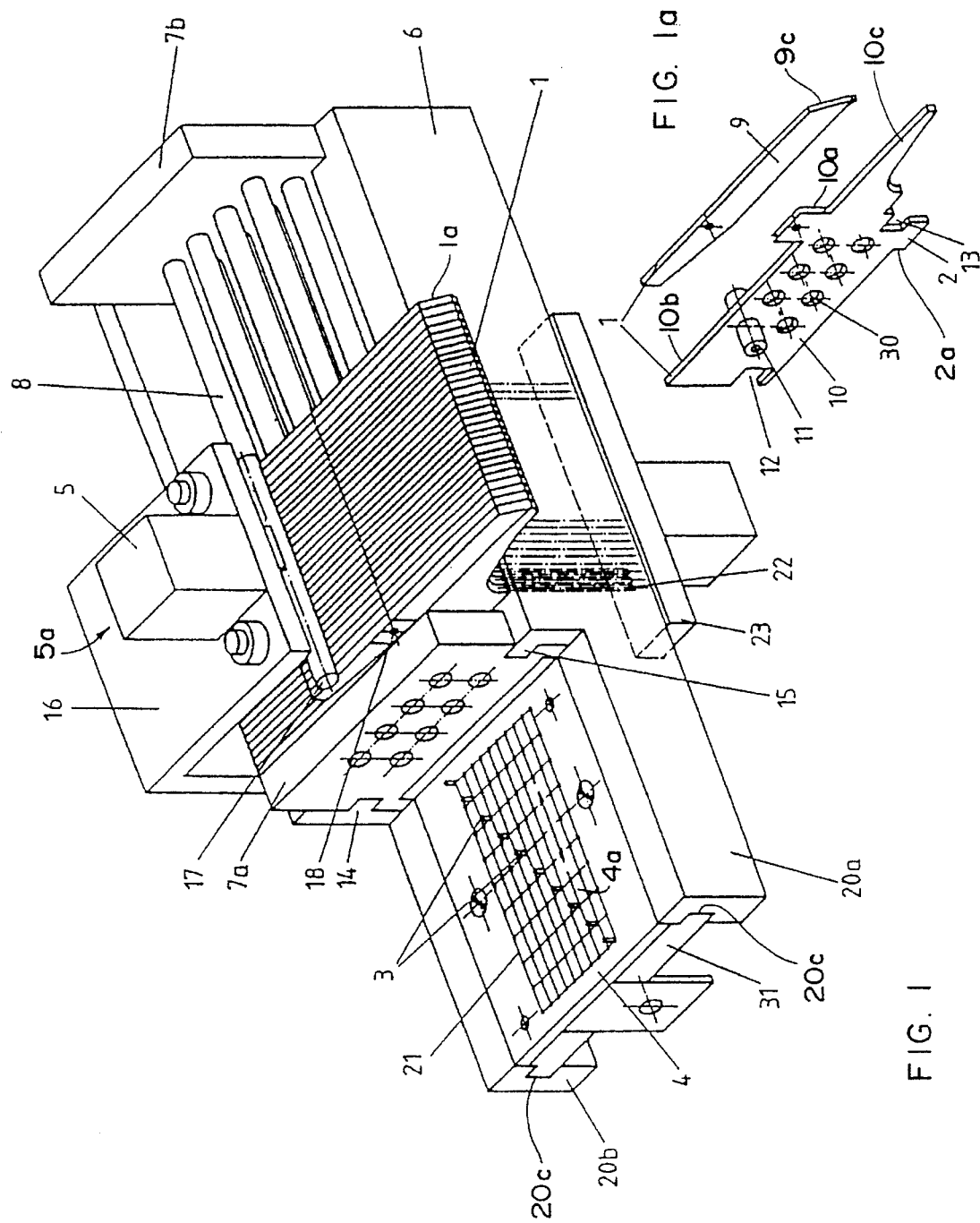
FIG. 1 illustrates a first embodiment of the device according to the invention.
FIG. 1a is an enlarged exploded detailed view of one of the clamps or tongs defining an object carrier or support, as used in the device of FIG. 1.
Figure 2:
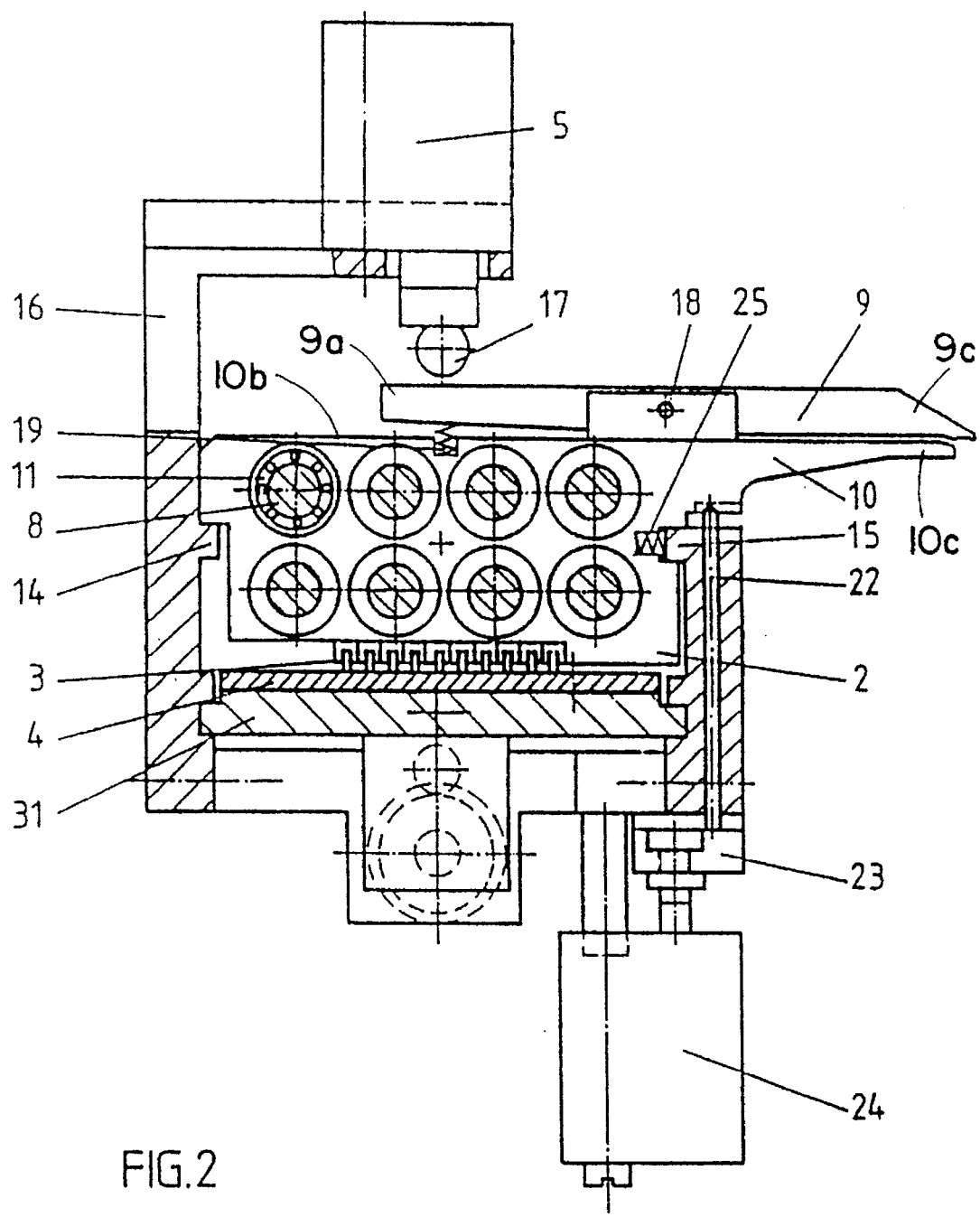
FIG. 2 illustrates a sectional view of the device of FIG. 1.

The device in accordance with FIGS. 1 and 2 has a plurality of guide columns 8 extending parallel to each other and disposed on a carrier 6 between two supports 7a, 7b. They are used as guides for each one of a plurality of object carriers, for example clamps or tongs 1, which are movable between the supports 7a, 7b. Each clamp or clamp member has an upper clamp jaw 9 and a lower clamp jaw 10. The lower clamp jaw 10 is provided with a bushing or guide sleeve 11 having a ball bearing, through which extends one of the guide columns 8. In the embodiment under consideration, the clamps are very narrow, so that for reasons of stability the guide sleeves 11 protrude somewhat on both sides of a related clamp member, as seen in FIG. 1a. Notwithstanding such design and in order to enable arranging the individual clamps 1 as close as possible to each other, adjacent clamps 1 are guided on different guide columns 8. Furthermore, the guide sleeve 11 of each clamp 1 freely extends on both sides through corresponding bores 30 of the adjacent clamps 1. The thickness of clamps 1 can be freely selected.

With further reference to FIGS. 1 and 1a, the lower gripping jaw 10 is provided at its two longitudinal ends with a respective cutout 12, 13, which engage with guides or tracks 14, 15 of the carrier or support. Upon displacement of the clamps or tongs 1, such slide along the guides or tracks 14, 15. As seen in FIG. 2, a pressure spring 25 located between the lower gripping jaw 10 and the guide or track 15 ensures that the displacement of the clamps 1 takes place uniformly. In FIG. 1 all clamps 1 are disposed without gaps between each other in an initial position, hereinafter called the application or mounting region E (see FIGS. 3a and 3b).

All of the clamps 1 located in the application or mounting region E are located beneath a clamp activation device 5a, which will now be considered in greater detail. This device 5a essentially consists of a pneumatic cylinder 5 fixed on a support 16, which acts with its piston on a pressure rod 17 which, in turn, acts on the upper clamp jaws 9 of all clamps 1 located in the application or mounting region E when the cylinder 5 is actuated. The upper clamp jaw 9 of each clamp 1 is seated in a holder of the lower clamp jaw 10 and is rotatably seated on a shaft 18. With reference to FIG. 2, a pressure spring 19 is vertically positioned between the rear part 9a of the upper clamp jaw 9, which does not rest on the lower clamp jaw 10 in the closed position of the clamp 1, and the rear part 10b of the lower clamp jaw 10. When opening the clamp 1, the pressure rod 17 pushes on the rear part 9a of the upper clamp jaw 9 against the pressure spring 19. As soon as the pressure action of the cylinder 5 is no longer present, the clamp 1 automatically assumes the closed position because of the action of the pressure spring 19. The two front ends 9c, 10, of the clamp 1 are shaped in accordance with the object to be grasped or engaged.

The lower clamp jaw 10 of the clamp or tong 1 is provided on its lower long side with a positioning marker or mark 2, which is formed by a section having a length which is different for each of the clamps 1. In the embodiment of FIG. 1 the forwardmost clamp 1 (first clamp on the left) has the shortest section 2a. For each successive clamp 1 this section is progressively longer by a set value, i.e., it is longest in the rearmost clamp 1. The carrier or support 6 of the device in accordance with the embodiment FIG. 1 furthermore has two steps 20a and 20b each provided with a guide groove or track 20c into which there can be horizontally inserted a slide or carriage 31. This slide or carriage 31 is equipped with an exchangeable, plate-shaped positioning device 4. The slide or carriage 31, together with the device 4, are displaceable below the rails 8 by pneumatic means, e.g., not shown in further detail, in the direction of the clamps 1.

With further reference to FIG. 1, the top surface of the plate-shaped positioning device 4 is provided with openings or holes 4a arranged in a mesh-like grid pattern 21 provided on the top of the plate 4, into which positioning pins 3 can be inserted. The grid pattern spacing is coordinated with dimensions of the different positioning markers 2 of the clamps 1 and to the spacing between the clamps 1. When the carriage 31 is inserted, each one of the positioning pins 3 inserted in the plate 4 impacts against the corresponding positioning marker 2, whereupon the corresponding clamp 1 and any further clamps 1 located immediately behind it—in FIG. 1 the clamps located to the right of clamps 1 whose positioning marker 2a has been contacted by the associated positioning pin 3—are displaced towards the rear. The positioning pins 3 can be selectively inserted within the preset grid pattern. In this way it is possible, by means of the positioning device 4, to achieve in a simple manner any predetermined arrangement of the clamps 1 in relation to each other.

To fix the clamps 1 in the desired arrangement, a vertical arresting pin 22 is inserted in the part of the carrier 6 containing the guide 15 at each possible clamp position within the application or mounting region E. All of the pins 22 are fixed with their lower ends on a connecting element 23 which is connected with a pneumatic lifting device 24 as shown in FIG. 2, and can be displaced by the latter in a vertical direction. As soon as the clamps 1 have assumed the desired position, the lifting device 24 is activated and all clamps 1 located in the application or mounting region E are fixed.

It is, of course, also possible to use, in place of the clamps 1, other known object carriers of a positive-locking, force-locking or frictional-locking type, such as gripping elements operated magnetically or by means of a vacuum. The operation of the device in accordance with the invention is thus not affected.

The principle illustrated in FIG. 1 does not absolutely require that the positioning plate 4 be displaceable in the direction of the object carriers for positioning the object carrier. It is readily conceivable to fix the plate 4 in the application or mounting region E and to move the object carriers, which are connected with each other by elastic means, into the application or mounting region E from the outside, where they run up against the positioning pins 3. In this way it is also possible to generate any desired arrangement of the object carriers with respect to each other. This procedure corresponds to a kinematic reversal of the principle described above in conjunction with that of FIG. 1.

Figure 3A:
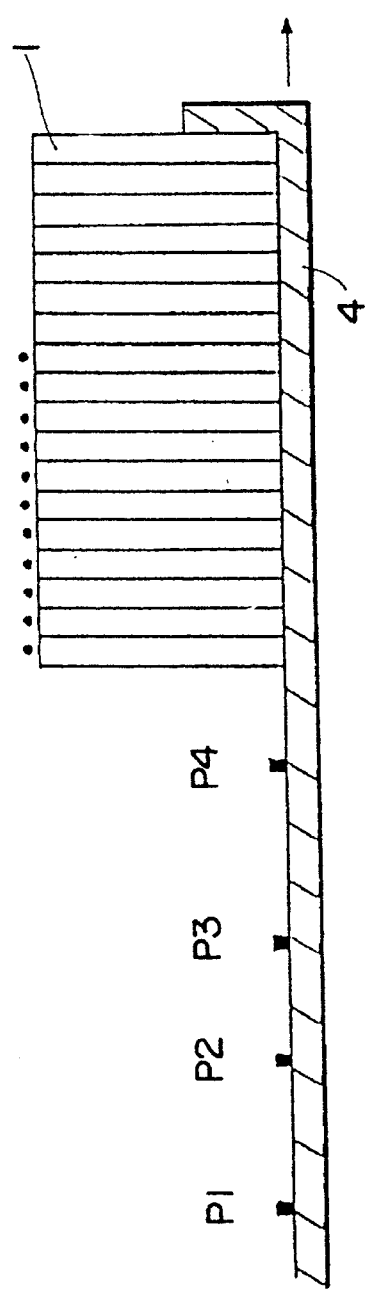
FIGS. 3a and 3b illustrate two operating positions of the device of FIG. 1 for the purpose of demonstrating the operation thereof.
Figure 3B:
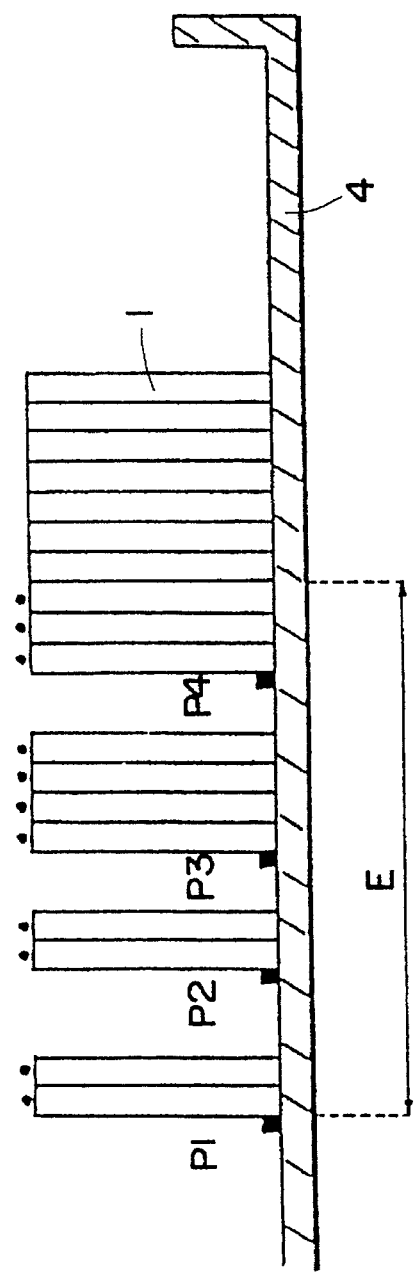

The mode of operation of the device will be explained with the help of a practical example by means of FIGS. 3a and 3b, which relates to its use in connection with fitting of pin and socket connectors with contact elements, i.e., with contact pins or blades. FIG. 3a shows the initial position of the apparatus. It is assumed that the total number of clamps or tongs 1 available is eighteen, which initially are located in the application or mounting region E. Thus, this number corresponds to the maximum number of connecting pin positions which can be simultaneously mounted or fitted. As will be best understood by referring to FIG. 3b, the pattern for the row of contacts to be fitted, having eighteen pin positions, is as follows: 3 contacts—2 empty positions—4 contacts— 2 empty positions—2 contacts—3 empty positions—2 contacts. Thus, only a total of eleven contact elements need to be inserted and certain intermediate positions are to remain empty.

In the starting position the plate 4, which has been provided with positioning pins P1, P2, P3, P4 in accordance with the desired pattern, has not yet been inserted. Through means, not shown in detail, the device is now brought into a position in which the first eleven clamps 1 (from the left) can access the carrier or support supplying the contact elements in accordance with the number of the eleven contact positions to be fitted. The eleven clamps 1 each remove one contact element and grip it. In FIG. 3a the clamps 1 are marked with a dot at their free ends. Subsequently, the positioning plate 4, equipped with the positioning pins P1, P2, P3, P4 arranged in the desired pattern, is displaced towards the right in the device shown in FIG. 1. Consequently, the clamps 1 are displaced towards the right in sets in accordance with the arrangement of the positioning pins P1, P2, P3, P4. As a result, the positioning pin P4 runs up against and engages the positioning marker 2 of the tenth clamp 1 from the right, because of which it, along with the nine clamps 1 located behind it, is displaced to the right into a position in which the seven clamps 1 which do not have contact elements are outside of the application or mounting region E. Therefore, only three clamps 1 of the first shifted set remain in the application or mounting region E, namely those with contact elements. In the course of displacement, the position pin P3 runs up from the right against the positioning marker 2 of the fourteenth clamp 1 and pushes it to the right, along with the three clamps 1 located behind it. Corresponding action occurs with the positioning pins P2 and P1, which finally results in the arrangement of the clamps 1 illustrated in FIG. 3b. This arrangement corresponds to the desired pattern of the contact arrangement on the pin and socket connector.

In this way all clamps or tongs 1 carrying a pin are in the application or mounting region E of the device. It is now possible to bring the latter into a position in which the contact elements are directly pressed in. Alternatively, it is possible to transfer it to a fitting installation, for example a pressing station, where the contact elements are simultaneously inserted in one operation into the pin and socket connector.

FIGS. 4a and 4b illustrate another design or embodiment of the positioning device 4. As shown in FIG. 4a, the plate 4 has a groove-like depression, which forms a programming plate 40 into which spacing elements 41 and positioning elements 42 can be selectively placed next to each other. As best seen in FIG. 4b, these elements are slightly angled on both their ends and can be inserted in this manner between the correspondingly formed edges of the programming plate 40. Spacing elements 41 of different widths are provided. The positioning elements 42 have a cam 43 on their tops. Positioning elements 42 having cams 43 of different length are provided. Thus, the positioning plate 4 can be programmed with the help of a set of different spacing and positioning elements 41, 42 in such a way that the desired arrangement of the object carriers is achieved when it is displaced in the direction of the object carriers 1 (FIG. 1). The spacing and positioning elements 41, 42 inserted into the programming plate 40 are fixed on both sides by means of a respective fixing strip 44, 45. Essentially the displacement of the object carriers into their intended positions occurs in the same way as described above with respect to FIGS. 3a, 3b. An example for generating an arrangement with (from the right) three occupied positions—2 empty position—4 occupied positions—2 empty positions—2 occupied positions—3 empty positions—2 occupied positions, is shown in FIGS. 4c, 4d. Of the total of eighteen object carriers available in this embodiment, after displacement eleven of them are inside and the remaining seven are outside of the application or mounting region E. For clarity, the employed elements 41, 42 are designated with letters in FIGS. 4a and 4b.

Figure 5A:
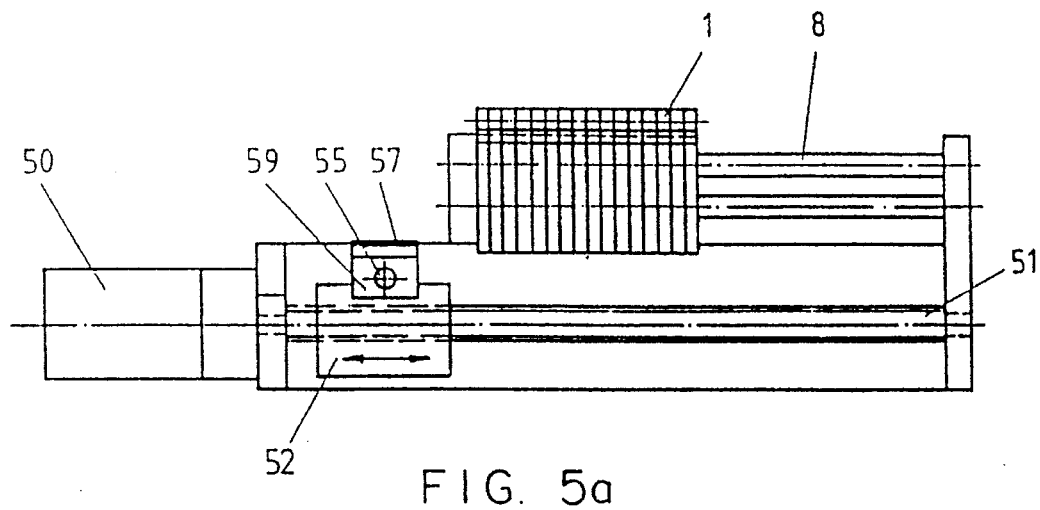
Figure 5B:
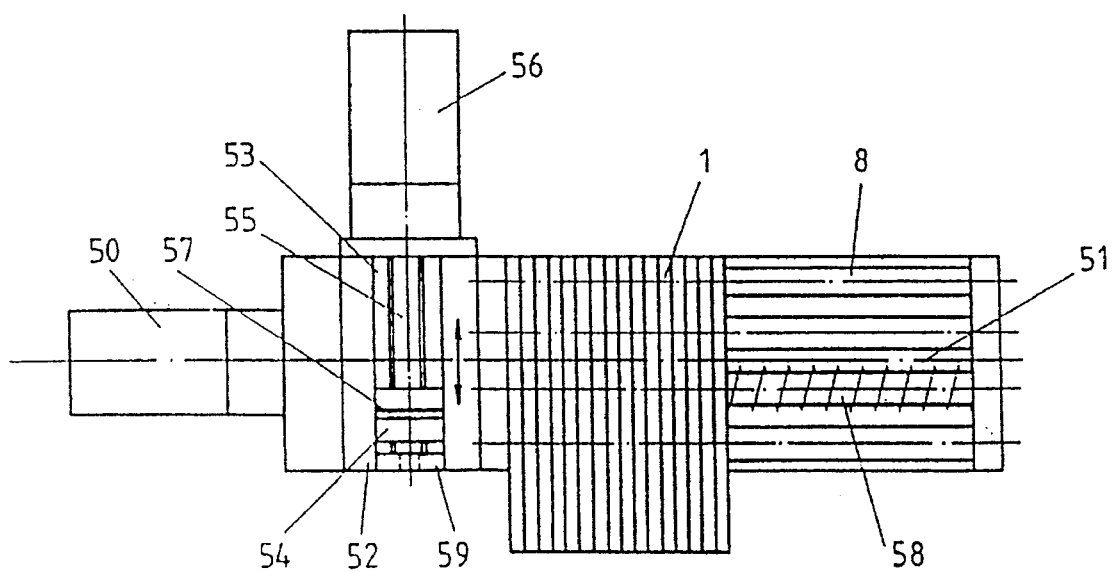

The positioning device 4 can also be designed as a twin axis control. The parts of such a control which are essential in this connection are shown in FIG. 5a in a side view and in FIG. 5b in a top plan view. A support 42 is provided on a spindle 51, extending parallel to the guide columns 8 and driven, for example, by a step motor 50. The support 52 has a horizontally extending guideway 53, which is disposed perpendicularly with respect to the spindle 51, in which a carriage 54 is located which is displaceable in the guideway 53 via a further spindle 55 by a further step motor 56. The spindle 55 is held at the end of the guideway 53 in a bearing block 59. The carriage 54 has a cam 57 extending perpendicularly with respect to the object carriers 1. Thus, the cam 57 can be brought into any desired position within the guideway 53 by means of the step motor 56. Consequently, it is possible to bring the object carriers 1 into a desired arrangement through a corresponding control of the step motors 50, 56. In this case the object carriers 1 are pushed against a pressure spring 58. The displacement of the object carriers 1 takes place in steps, in that after every displacement of a set of object carriers 1 the carrier 54, and thus, the cam 57 are first again brought into a position required for displacing the next set. Control of the step motors 50, 56 can be achieved by means of a selectively programmable control, which allows a particularly simple generation of the most diverse arrangements of the object carriers 1. The pressure spring 58 ensures that the object carriers 1 are entrained as soon as the support 52 moves to the left for the purpose of returning into the initial position.

A further embodiment of the positioning device 4 in the form of a twin axis control is shown in FIG. 6a, in a side view, and in FIG. 6b in a top plan view, and also additionally in FIG. 6c in a sectional view taken at line 6c—6c of FIG. 6b, perpendicular to the displacement direction of the object carriers 1. The latter are guided by the guide columns 8. The object carriers 1 possess on their downwardly oriented side a semi-circular cut out, the edge of which is provided with the individual positioning markers 2. These markers 2 are in the shape of circular sections of different length, formed of one piece with the edge. A step motor 61 is connected by means of drive elements to a spindle 62, with which a carriage 63 is coupled. This carriage 63 engages a circular groove 64 of a cylindrical positioning element 65, which is connected radially fixed with a splined shaft 66 and is coupled with it in an axially displaceable manner. The shaft 6 is coupled via drive elements with a further step motor 67. The positioning element 65 ha a cam 68 on the end facing the object carriers 1. Again, displacement of the object carriers 1 into a desired position in relation to each other is essentially performed in steps in the same way as in the previous example. First, the cam 68 is brought into the required position by means of the step motor 67 through the turning of the positioning element 65, and subsequently the carriage 63 is moved to the right by the required distance by means of the step motor 61, in the course of which the appropriate first set of object carriers reaches the desired position. Following this, the positioning element 65 is returned towards the length into its initial position and at that location again rotated until the cam 68 takes up the correct position. Subsequently, the positioning element 65 is again displaced to the right and thus, the next set of object carriers 1 is brought into the desired position and so forth. In this example, too, it is possible to control the step motors 61, 67 by means of selectively programmable control in order to thus generate any specific arrangement of the object carriers 1. A pressure spring 69 has the same function as the pressure spring 58 in FIG. 5b.

Figure 7:
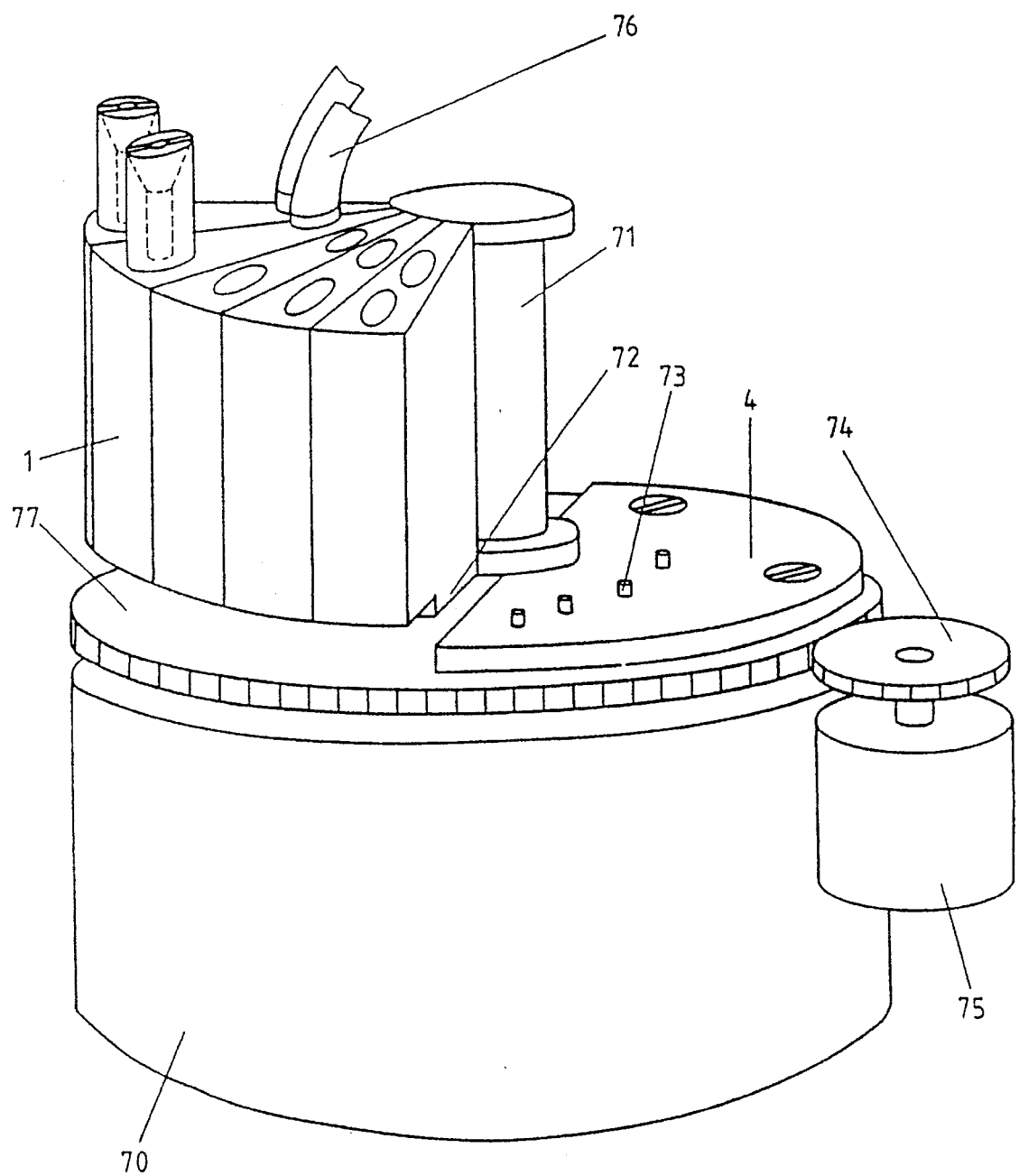
FIGS. 7 and 8a–b illustrate further embodiments of the device.

The principle of the device according to the invention can also be employed if the displacement track of the object carriers does not extend along a straight line, but in the shape of a curve. FIG. 7 illustrates the essential features of such a device. Radially extending object carriers 1 are rotatably disposed on a support shaft 71 maintained on a base body 70 in such a way that they are pivotable in a circular path around the shaft 71. In this example, the object carriers 1 are equipped with gripping clamps which can be actuated pneumatically via feed lines 76. Again, each object carrier 1 is provided on its side facing the base body 70 with a positioning marker 72 in the shape of a step of individual length. An exchangeable, disk-shaped positioning plate 4 is disposed on a base plate 77 between the object carriers 1 and the base body 70, which can be rotated around the shaft 71. Rotation of the base plate 77 takes place by means of a drive wheel 74 which is connected with a motor 75. Positioning pins 73 can be inserted into the plate 4. They are distributed in such a way that, when the base plate 77 is rotated, the object carriers 1 arrive in the desired arrangement in a circular application or mounting region E from the initial position shown. Thus, the creation of a certain order of the object carriers 1 in relating to each other is achieved in principle in the same way as in the device in accordance with FIG. 1, so that further explanations thereof are not needed.

Figure 8A:
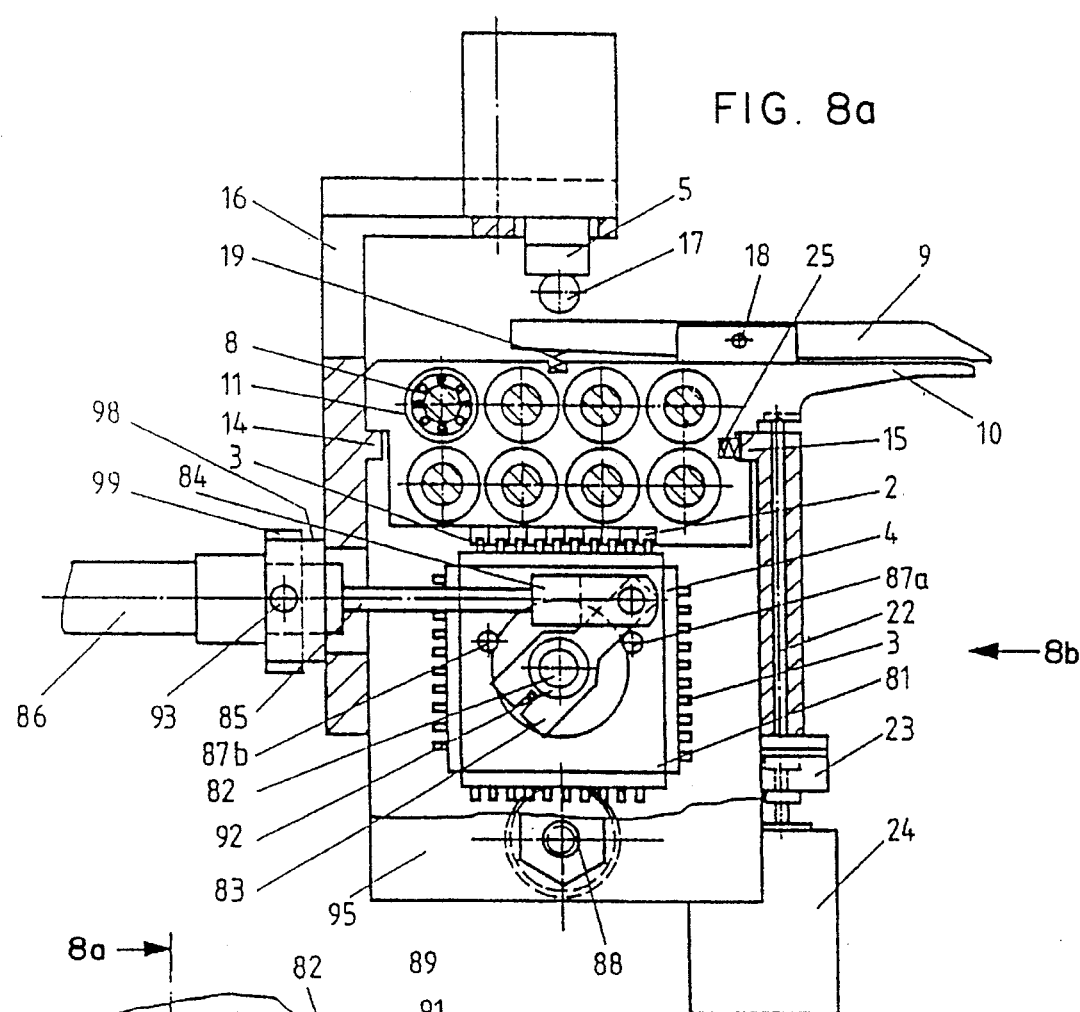
Figure 8B:
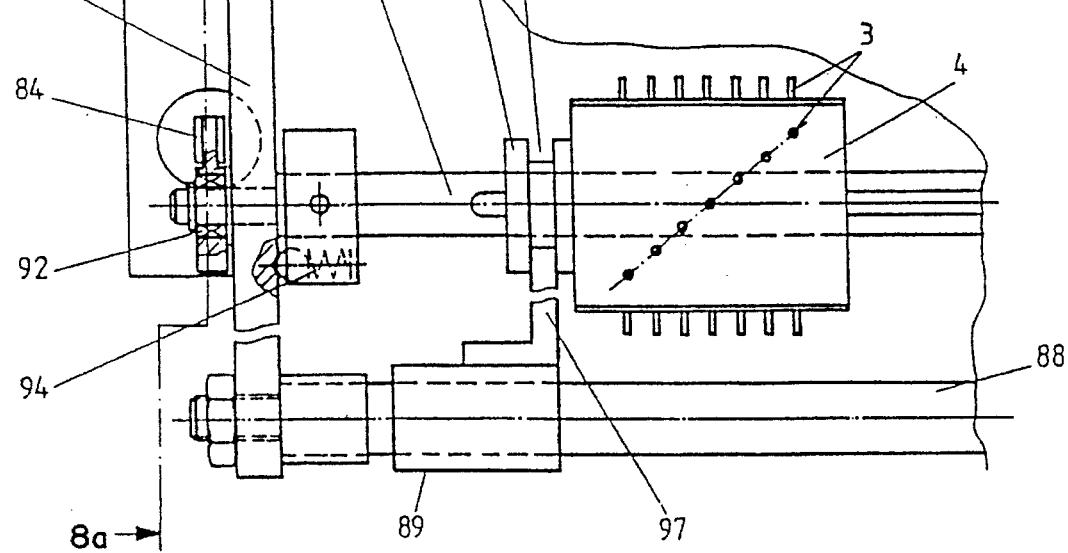

All embodiment of the device in accordance with the invention having more than one positioning device is shown in FIG. 8a in a top plan view and in FIG. 8b in the bottom in a sectional view. Parts corresponding to those in FIGS. 1 and 2 have been designated with the same reference numerals. This example has four plate-shaped positioning devices 4 disposed on the sides of a prismatic support 81, into which positioning pins 3 can be inserted in a selectively chosen manner. The support 81 is disposed on a splined shaft 82 so as to be longitudinally displaceable, but not rotatable, i.e., the support 81 is radially fixed on the splined shaft 82 and turns when the splined shaft 82 is turned. A lever 83 is connected by means of a free-wheeling clutch 92 with the shaft 82. If the lever 83 is moved from its indicated position towards the left, it entrains the shaft 82; but if it is again moved to the right, free-wheeling is accomplished between the lever 83 and the shaft 82, for which reason the latter does not turn with it. The lever 83 is connected on its free end via a hinged body 84 with rods 85 which are connected with the piston of a cylinder 86 which is pneumatically driven, for example. The end of the cylinder 86 is seated in a pivot bearing 99. The pivot bearing 99 is seated in a hinged manner by means of a bearing shaft 93 on a pillow block 98 which is fixed on the support 6 which contains the guide 14. When the cylinder 86 is activated, it pulls the lever 83 out of the indicated position away from the stop 87a against the stop 87b, as result of which the support 8a is tilted to the left by 90 degrees. Accordingly, the next plate 4 with a different arrangement order of the positioning pins 3 is placed into the active position opposite the positioning markers 2 on the object carriers (clamp jaws 9, 10). Subsequently, the lever 83 is again brought into its initial position at the stop 87a, while the support 81 remains in its position because of the free-wheeling clutch 92. Longitudinal displacement of the support 81 on the splined shaft 82 can take place in principle in the same manner as in the embodiment according to FIG. 6 or by means of a cylinder 88 without a piston rod, on which a carriage 89 is disposed. The latter engages via a connecting piece 97 with a circular groove 90 provided in a coupling element 91 connected with the support 81. A stop element 94 fixed on the shaft 82 ensures that the shaft 82 is arrested against a stay 95 as soon as the support 81 has taken up the desired position.

With this embodiment it is possible to use sequentially up to four plates 4, differently fitted with positioning pins 3, for positioning the object carriers. This is advantageous, for example, when fitting multi-row pin and socket connectors where each row has a different pattern for the arrangement of the contacts.

Figure 9:
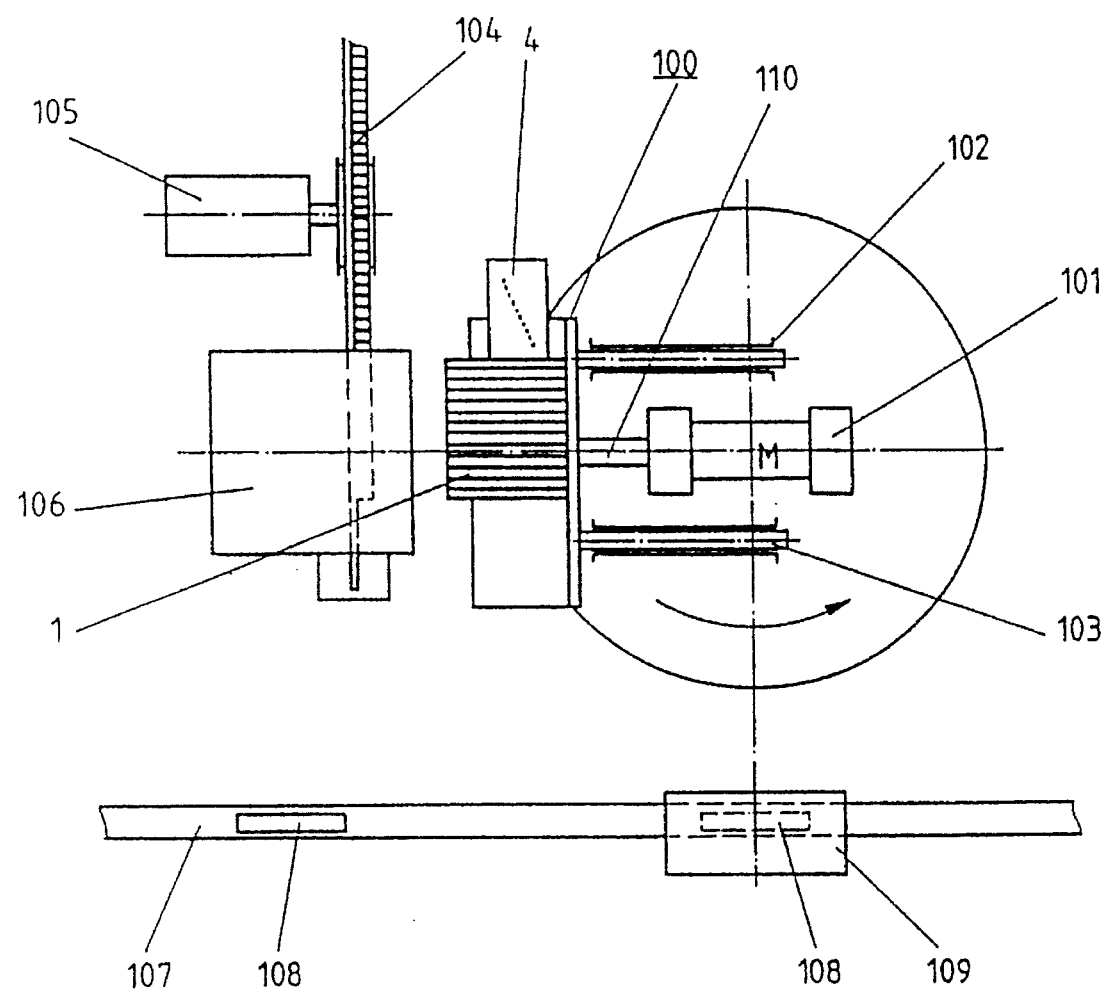
FIG. 9 illustrates an example of use of the device according to the invention.

FIG. 9 illustrates the principle for the mentioned use of the device according to the invention for fitting pin and socket connectors with contact elements. It shows a top plan view of an installation containing the device. The device 100 is fixed on a support 101, which is rotatable around on axis M extending perpendicularly in relation to the plane of the illustration. Additionally, the device 100 is slidable in the direction of the longitudinal axis of the support 101 on guides 102, 103 disposed on the support 101. The support 101 is in he form of a pressure cylinder, the piston rod 110 of which is connected with the device 100. A band or conveyor 104 containing the contact elements is driven by means of a feed device 105, which is programmable with respect to the number of contact elements to be supplied, into a separator device 106, which separates the desired number of contact elements, from the band 104 and singles them. The infeed in rows of the contact elements can also be performed in another known way. The device 100 removes with its object carriers 1 these contact elements from the separator device 106. Subsequently, the object carriers 1 are brought into a predetermined position with respect to each other in accordance with the desired pattern for fitting the contacts, as previously described. Simultaneously, the device 100 is turned by 90 degrees toward a pressing station 109, to which the pin and socket connector bodies 108 are fed on a conveyor 107. Each pin and socket connector body 108 is brought into the correct position for inserting the contact elements in the pressing station 109. Then the device 100 inserts the contact elements into the pin and socket connector body 108 in the correct positions. By the simultaneous use of a plurality of devices 100, for example four, with differently programmed positioning devices 4, it is possible in an advantageous manner by means of this arrangement to fit pin and socket connector bodies 108 having rows of contacts with varied fitting patterns. The use of a plurality of devices 100 is also advantageous if multi-row pin and socket connectors are to be fitted with the same pattern, because in this case the time per cycle can be decreased. Longitudinal displacement of the support 101 and its rotation can be performed with known, pneumatically operated means. Control of the support 101, the feed element 105, the separator device 106 and the conveyor 107 can be performed by a central control device which is programmable, taking into account the predetermined cycle rates.

The use of the device according to the invention is by no means limited to fitting contact elements to pin and socket connectors. It can also be used in installations for fitting circuit boards, by means of machines, with different electrical or electronic components, in which case appropriately designed object carriers must be provided. It is also conceivable to provide in one device differently designed object carriers, each of which corresponds with respect to their number and shape to the objects to be manipulated.

A further possibility of use in the field of electric technology consists in the automatic transfer of components from a first grid pattern into a different, second grid pattern. This requirement arises, in particular, when refitting the contact elements of a test adapter from a first to a second grid pattern for adapting the test adapter to various test objects. In this connection it is immaterial whether these two grid patterns are regular or irregular grid patterns, since the device can be adapted in principle to any grid patterns by appropriate programming of the displacement of the object carriers.

A further advantageous possibility of use offers for the mounting of SMD components on electrical circuit boards, in that the adhesive to be applied on the circuit boards at the places intended for the components is supplied by one or a plurality of appropriately designed object carriers. In this case the object carriers, connected with a reservoir for the adhesive and equipped, for example, with a nozzle, are not actually used for gripping objects and generating a predetermined arrangement of the objects, but for receiving and of the directed distribution of a manufacturing material.

These examples suggest the multiplicity of conceivable possibilities of use of the device in accordance with the invention, where many cases of use outside of electrical technology are easily possible. Basically, it can be used in all cases where objects which are selectively chosen must be gripped, brought into a defined relationship to each other and delivered in this way.

We claim:

1. A device for manipulating objects with object carriers for gripping, holding and releasing the objects, said device comprising:

a support apparatus (6) comprising at least one common guiding and support element (8, 71);

a plurality of at least three object carriers (1) being moveable laterally with respect to one another along said common guiding and support element (8, 71); and means (3, 4a, 31) for moving said plurality of object carriers along said common guiding and support element (8, 71) between a first positional arrangement wherein the object carriers (1) are uniformly positioned relative to each other and a second positional arrangement wherein the object carriers (1) can be selectively, non-uniformly spaced relative to each other;

said means (3, 4a, 31) being selectable or adjustable for selectively varying the positions and relative spacings of the object carriers (1) in the second positional arrangement; and said object carriers (1) being used simultaneously receiving objects arranged in said first positional arrangement and for simultaneously delivering said objects arranged in said second positional arrangement.

2. The device in accordance with claim 1, wherein:

said object carriers comprise tongs.

3. The device in accordance with claim 1, wherein:

said plurality of object carriers further comprising respective locating marks; and said means (3, 4a, 31) comprises:
 a plate;
 means for moving said plate along said support apparatus; and
 insertable positioning elements selectively insertable within said plate, said selectively insertable positioning elements being operative for engaging respective ones of said locating marks and for said moving of said plurality of object carriers along said support apparatus for non-uniform displacement and spacing of said plurality of object carriers.

4. The device in accordance with claim 3, wherein:

said plate comprises holes; and said positioning elements comprise pins inserted within said holes.

5. The device in accordance with claim 3, further comprising:

locking members for fixing said object carriers in place after said non-uniform displacement and positioning.

6. A device according to claim 1, wherein:

said support apparatus comprises a linear track and said means for moving comprises means for moving said object carriers linearly along said linear track.

7. A device according to claim 1, wherein:

said support apparatus comprises a curved track and said means for moving comprises means for moving said object carriers arcuately along said curved track.

8. A device according to claim 1, wherein:

said object carriers comprise clamps, each said clamps having opposed jaws and means for moving at least one of said opposed jaws toward the other.

9. A device according to claim 1, wherein:

said object carriers comprise a member selected from the group consisting of tongs, vacuum grippers and magnetically operated grippers.

10. A device according to claim 1, wherein:

each of said object carriers further comprising a positioning marker;

said means for moving said object carriers between said first positional arrangement and said second positional arrangement comprises a positioning device, said positioning device comprising a twin axis control;

said twin axis control includes a first shaft and a second shaft, a support longitudinally displaceable along said first shaft and a carriage laterally displaceable along said second shaft, said second shaft being perpendicular to said first shaft, said carriage having a positioning element secured thereto for engagement with said positioning markers of said object carriers;

means for displacing said support longitudinally along said first shaft for selective longitudinal positioning of said positioning element of said carriage; and means for displacing said carriage laterally toward said object carriers, whereby said positioning element of said carriage engages respective ones of said positioning markers for said laterally moving of at least said respective ones of said object carriers a selectively variable extent to said second positional arrangement, wherein in said second positional arrangement, said respective ones of said object carriers are located in an application region for said simultaneous delivering of objects arranged in said second positional arrangement.

11. A device according to claim 1, wherein:

each of said object carriers further comprising a positioning marker;

said means for moving said object carriers between said first positional arrangement and said second positional arrangement comprises a positioning device, said positioning device comprising a twin axis control;

said twin axis control includes a first shaft and a second shaft, said first shaft and said second shaft being parallel, a carriage laterally displaceable along said first shaft and a positioning element rotatably mounted around said second shaft, said positioning element comprising a cam for engagement with said positioning markers of said object carriers; and means for rotating said second shaft for selective radial positioning of said cam of said positioning element;

means for displacing said carriage laterally toward said object carriers, whereby said cam of said positioning element of said carriage engages respective ones of said positioning markers for said laterally moving of at least said respective ones of said object carriers a selectively variable extent to said second positional arrangement, wherein in said second positional arrangement, said respective ones of said object carriers are located in an application region for said simultaneous delivering of objects arranged in said second positional arrangement.

12. A method of using the device of claim 1, said method comprising the steps of:

feeding a row of predeterminedly positioned objects along said device and presenting a predetermined number of said objects at a removal station;

removing said predetermined number of said objects at said removal station by grasping said objects with respective ones of said object carriers while said object carriers are positioned in said first positional arrangement, wherein said object carriers are predeterminedly positioned and spaced relative to each other;

moving said object carriers along said common track from said first positional arrangement to said second positional arrangement, wherein said object carriers are selectively laterally spaced relative to each other;

feeding a row of carriers along said device and presenting a carrier at an insertion station; and inserting said objects while in said second positional arrangement into said carrier at said insertion station.

13. A method of using the device of claim 1, said method comprising the steps of:
   presenting a predetermined number of said objects disposed in a first grid pattern at a first station;
   removing said predetermined number of said objects at said first station by grasping said objects with respective ones of said object carriers while said object carriers are positioned in said first positional arrangement, wherein said object carriers are predeterminedly positioned and spaced relative to each other;
   moving said object carriers along said common track from said first positional arrangement to said second positional arrangement, wherein said object carriers are selectively laterally spaced relative to each other in a second grid pattern; and
   transferring said objects a second station to a device for receiving said objects, while said objects are positioned in said second grid pattern.

14. A method of using the device of claim 1, said method comprising the steps of:
   moving said object carriers along said common track from said first positional arrangement to said second positional arrangement, wherein in said second positional arrangement said object carriers are selectively laterally spaced relative to each other; and
   fitting a component support with mechanical or electrical components with said object carriers while said object carriers are in said second positional arrangement.

15. A device according to claim 1, wherein:
   each of said object carriers further comprising a positioning marker;
   said common track comprises a track for supporting and guiding said object carriers in lateral and radial succession along a circular path;
   said means for moving said object carriers between said first positional arrangement and said second positional arrangement comprises a positioning device, said positioning device comprising a plate having selectively insertable positioning elements;
   means for displacing said plate laterally along said circular path said object carriers, whereby said positioning elements of said plate of said positioning device engage respective ones of said positioning markers for said laterally moving of at least said respective ones of said object carriers a selectively variable extent to said second positional arrangement, wherein in said second positional arrangement, said respective ones of said object carriers are located in an application region for said simultaneous delivering of objects arranged in said second positional arrangement.

16. A device according to claim 15, wherein:
   said plate having an array of holes; and
   said positioning elements comprise pins inserted within predetermined ones of said array of holes.

17. A device according to claim 15, further comprising:
   stops for fixing said object carriers in position in said second positional arrangement after displacement thereto.

18. A device according to claim 1, wherein:
   said means for moving said object carriers between said first positional arrangement and said second positional arrangement comprises a positioning device, said positioning device comprising a plate having selectively insertable positioning elements;
   each of said object carriers comprises a positioning marker for engagement with one of said positioning elements of said plate of said positioning device;
   means for displacing said plate laterally toward said object carriers, whereby said positioning elements of said plate of said positioning device engage respective ones of said positioning markers for said laterally moving of at least said respective ones of said object carriers a selectively variable extent to said second positional arrangement, wherein in said second positional arrangement, said respective ones of said object carriers are located in an application region for said simultaneous delivering of objects arranged in said second positional arrangement.

19. A device according to claim 18, wherein:
   said plate having an array of holes; and
   said positioning elements comprise pins inserted within predetermined ones of said array of holes.

20. A device according to claim 18, wherein:
   said plate of said positioning device comprises a programmable plate, said positioning device further comprising a plurality of spacing elements, each of said spacing elements having a predetermined lateral width and being laterally movably positionable within said programmable plate for laterally spacing said positioning elements within said programmable plate.

21. A device according to claim 18, further comprising:
   stops for fixing said object carriers in position in said second positional arrangement after displacement thereto.

22. A device according to claim 18, wherein:
   said positioning device comprises a plurality of said plates, said device further comprising means for selectively pivoting one of said plurality of plates into a predetermined position for subsequent lateral displacement toward said object carriers.

23. A device according to claim 22, further comprising:
   a shaft;
   a support having respective sides for radially supporting said plurality of plates with respect to said shaft;
   means for axially displacing said shaft;
   a drive and a freewheeling clutch for selective activation of said drive for turning said shaft through a predetermined angle for movement of a selected one of said plates to a position corresponding with said first positional arrangement.

24. A device according to claim 22, wherein:
   said plate having an array of holes; and
   said positioning elements comprise pins inserted within predetermined ones of said array of holes.

25. A device according to claim 22, further comprising:
   stops for fixing said object carriers in position in said second positional arrangement after displacement thereto.

* * * * *